(12) United States Patent
Chae

(10) Patent No.: US 9,524,762 B1
(45) Date of Patent: Dec. 20, 2016

(54) SEMICONDUCTOR DEVICES HAVING INITIALIZATION CIRCUITS AND SEMICONDUCTOR SYSTEMS INCLUDING THE SAME

(71) Applicant: SK hynix Inc., Icheon-si Gyeonggi-do (KR)

(72) Inventor: Haeng Seon Chae, Yongin-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/850,520

(22) Filed: Sep. 10, 2015

(30) Foreign Application Priority Data

May 27, 2015 (KR) .......................... 10-2015-0074308

(51) Int. Cl.
| | | |
|---|---|---|
| *G11C 5/14* | (2006.01) | |
| *G11C 11/4076* | (2006.01) | |
| *G11C 11/4074* | (2006.01) | |
| *G11C 7/20* | (2006.01) | |
| *G11C 7/10* | (2006.01) | |
| *G11C 7/12* | (2006.01) | |
| *G11C 7/22* | (2006.01) | |
| *G11C 11/406* | (2006.01) | |
| *G11C 17/16* | (2006.01) | |
| *G11C 5/06* | (2006.01) | |

(52) U.S. Cl.
CPC ................. *G11C 7/20* (2013.01); *G11C 5/148* (2013.01); *G11C 7/10* (2013.01); *G11C 7/12* (2013.01); *G11C 7/22* (2013.01); *G11C 11/40611* (2013.01); *G11C 17/16* (2013.01); *G11C 5/063* (2013.01); *G11C 5/145* (2013.01); *G11C 11/4074* (2013.01); *G11C 11/4076* (2013.01)

(58) Field of Classification Search
CPC .. G11C 11/4074; G11C 5/063; G11C 11/4076; G11C 5/145; G11C 5/148
USPC .......................................... 365/196, 226, 222
See application file for complete search history.

(56) References Cited

U.S. PATENT DOCUMENTS

| 6,577,156 B2 | 6/2003 | Anand et al. | |
|---|---|---|---|
| 2002/0105844 A1* | 8/2002 | Leung ....................... | G11C 7/22 365/222 |
| 2002/0176279 A1* | 11/2002 | Kwon ..................... | G11C 5/143 365/185.18 |
| 2003/0223271 A1* | 12/2003 | Byeon .................... | G11C 5/147 365/185.18 |

(Continued)

FOREIGN PATENT DOCUMENTS

KR     1020140081345 A     7/2014

*Primary Examiner* — Ly D Pham
(74) *Attorney, Agent, or Firm* — William Park & Associates Ltd.

(57) ABSTRACT

A semiconductor device may include a boot-up operation circuit configured for executing a boot-up operation during a boot-up operation period after a power supply voltage signal reaches a predetermined level. The boot-up operation circuit may be configured for generating a boot-up period signal. The boot-up period signal may be enabled during the boot-up operation period. The semiconductor device may include a sensing circuit configured for sensing the boot-up period signal and a clock enablement signal to generate a first detection signal and a second detection signal. The semiconductor device may include an initialization circuit configured for executing an initialization operation in response to the first and second detection signals. Related semiconductor systems may also be provided.

23 Claims, 11 Drawing Sheets

(56) References Cited

U.S. PATENT DOCUMENTS

| | | | |
|---|---|---|---|
| 2009/0039932 A1* | 2/2009 | Kim | G11C 7/22 327/161 |
| 2015/0206571 A1* | 7/2015 | Ko | G11C 11/40618 365/222 |

* cited by examiner

SEMICONDUCTOR DEVICES HAVING INITIALIZATION CIRCUITS AND SEMICONDUCTOR SYSTEMS INCLUDING THE SAME

CROSS-REFERENCE TO RELATED APPLICATION

The present application claims priority under 35 U.S.C 119(a) to Korean Application No. 10-2015-0074308, filed on May 27, 2015, in the Korean Intellectual Property Office, which is incorporated herein by reference in its entirety as set forth in full.

BACKGROUND

1. Technical Field

Embodiments of the present disclosure generally relate to semiconductor devices and semiconductor systems and, more particularly, to semiconductor devices having initialization circuits and semiconductor systems including the same.

2. Related Art

In general, semiconductor devices may receive an external power supply voltage signal to operate. A level of the external power supply voltage signal may gradually increase with a certain slope from a ground voltage level to a target voltage level. In the event that the semiconductor devices receive the external power supply voltage signal to execute various operations including a read operation and a write operation while the level of the external power supply voltage signal increases to reach the target voltage level, the semiconductor devices may malfunction due to a low level of the external power supply voltage signal. Thus, the semiconductor devices may be designed to start the various operations after a level of the external power supply voltage signal reaches a target voltage level.

Each of the semiconductor devices may include various internal circuits for executing various operations such as a read operation and a write operation. It may be necessary to initialize the internal circuits included in the semiconductor device to allow for stable operation of the semiconductor device after the external power supply voltage signal is applied to the semiconductor device. In addition, data stored in memory cells included in the semiconductor device may need to have stable levels to allow for stable operation of the semiconductor device.

SUMMARY

According to an embodiment, a semiconductor device may be provided. The semiconductor device may include a boot-up operation circuit configured for executing a boot-up operation during a boot-up operation period after a power supply voltage signal reaches a predetermined level. The boot-up operation circuit may be configured for generating a boot-up period signal. The boot-up period signal may be enabled during the boot-up operation period. The semiconductor device may include a sensing circuit configured for sensing the boot-up period signal and a clock enablement signal to generate a first detection signal and a second detection signal. The semiconductor device may include an initialization circuit configured for executing an initialization operation in response to the first and second detection signals.

According to an embodiment, a semiconductor system may be provided. The semiconductor system may include a first semiconductor device and a second semiconductor device. The first semiconductor device may output a power supply voltage signal and a clock enablement signal. The second semiconductor device may execute a boot-up operation during a boot-up operation period after the power supply voltage signal reaches a predetermined level and may generate a boot-up period signal. The boot-up period signal may be enabled during the boot-up operation period. The second semiconductor device may execute an initialization operation in response to the boot-up period signal and the clock enablement signal.

According to an embodiment, a semiconductor system may include a first semiconductor device and a second semiconductor device. The first semiconductor device may output a power supply voltage signal and a clock enablement signal. The second semiconductor device may execute a boot-up operation during a boot-up operation period after the power supply voltage signal reaches a predetermined level and may generate a boot-up period signal. The boot-up period signal may be enabled during the boot-up operation period. The second semiconductor device may generate a reset flag signal in response to the boot-up period signal and the clock enablement signal and may output the reset flag signal to the first semiconductor device.

According to an embodiment, a semiconductor device may include a boot-up operation circuit configured for executing a boot-up operation and configured for generating a boot-up period signal. The semiconductor device may include a sensing circuit configured for sensing the boot-up period signal and a clock enablement signal. The semiconductor device may include an initialization circuit configured for executing an initialization operation if the clock enablement signal is enabled after the boot-up operation terminates.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Various embodiments may be directed to semiconductor devices having initialization circuits and semiconductor systems including the same.

Figure 1:
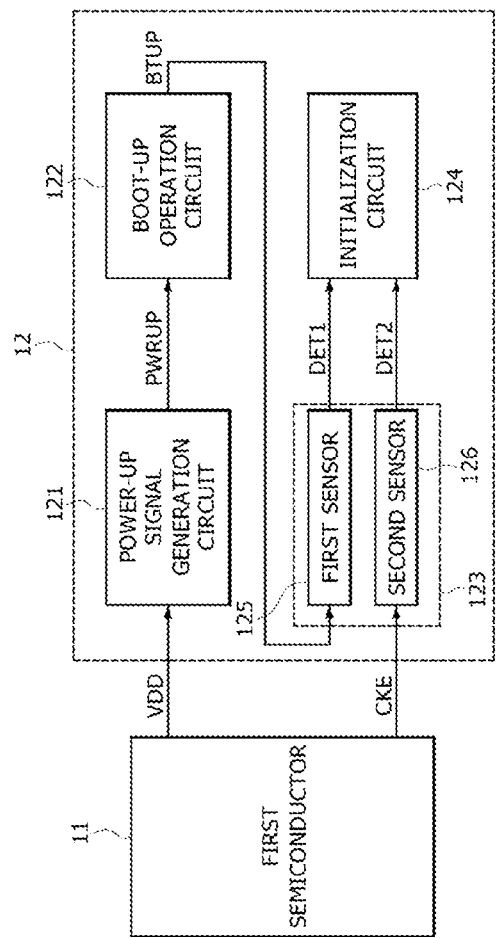
FIG. 1 is a block diagram illustrating a representation of an example of a semiconductor system according to an embodiment.

Referring to FIG. 1, a semiconductor system according to an embodiment may include a first semiconductor device 11 and a second semiconductor device 12. The second semiconductor device 12 may include a power-up signal generation circuit 121, a boot-up operation circuit 122, a sensing circuit 123, and an initialization circuit 124. The sensing circuit 123 may include a first sensor 125 and a second sensor 126.

The first semiconductor device 11 may apply a power supply voltage signal VDD and a clock enablement signal CKE to the second semiconductor device 12. In some embodiments, the clock enablement signal CKE may be transmitted together with an address signal (not illustrated) through the same signal line. Alternatively, the clock enablement signal CKE and the address signal may be separately transmitted through different signal lines. A level of the power supply voltage signal VDD may be set differently according to the various embodiments.

The power-up signal generation circuit 121 may sense a level of the power supply voltage signal VDD to generate a power-up signal PWRUP. In some embodiments, the power-up signal PWRUP may be set to have a logic "high" level during a time period (hereinafter, referred to as a power-up period) from a point of time that the power supply voltage signal VDD is applied to the second semiconductor device 12 till a point of time that the power supply voltage signal VDD reaches a target voltage level. The power-up signal PWRUP may be set to fall down to a logic "low" level from a logic "high" level after the power-up period ends. Alternatively, the power-up signal PWRUP may be set to have a logic "low" level during the power-up period and to rise up to a logic "high" level after the power-up period ends.

The boot-up operation circuit 122 may generate a boot-up period signal BTUP in response to the power-up signal PWRUP. The boot-up period signal BTUP may be enabled during a boot-up operation period, The boot-up operation circuit 122 may generate the boot-up period signal BTUP. The boot-up period signal BTUP may be enabled in synchronization with a point of time that a level of the power-up signal PWRUP is changed after the power-up period ends. After a boot-up operation is executed during the boot-up operation period, the boot-up period signal BTUP may be disabled. A logic level of the enabled boot-up period signal BTUP and a length of the boot-up operation period may be set differently according to the various embodiments.

The first sensor 125 may sense a point of time that the boot-up period signal BTUP is disabled, thereby generating a first detection signal DET1. For example, the first sensor 125 may generate the first detection signal DET1 which is enabled at a point of time that the boot-up period signal BTUP is disabled after the boot-up operation period ends. A logic level of the enabled first detection signal DET1 may be set differently according to the various embodiments.

The second sensor 126 may generate a second detection signal DET2 in response to the clock enablement signal CKE. For example, the second sensor 126 may generate the second detection signal DET2 and the second detection signal DET2 may be enabled at a point of time that the clock enablement signal CKE is enabled. The first semiconductor device 11 may output the clock enablement signal CKE which is enabled to generate an internal clock signal (not illustrated) of the second semiconductor device 12. Logic levels of the clock enablement signal CKE and the second detection signal DET2 which are enabled may be set differently according to the various embodiments.

The initialization circuit 124 may execute an initialization operation of the second semiconductor device 12 in response to the first and second detection signals DET1 and DET2. The initialization circuit 124 may be designed to execute the initialization operation of the second semiconductor device 12 if both of the first and second detection signals DET1 and DET2 are enabled. The initialization circuit 124 may include an auto-refresh operation, a temperature sense initialization operation, a data output initialization operation, and a power supply initialization operation. An active operation and a pre-charge operation of the second semiconductor device 12 may be executed by the auto-refresh operation. Thus, the auto-refresh operation may lead to a stable power management of the semiconductor system.

Figure 2:
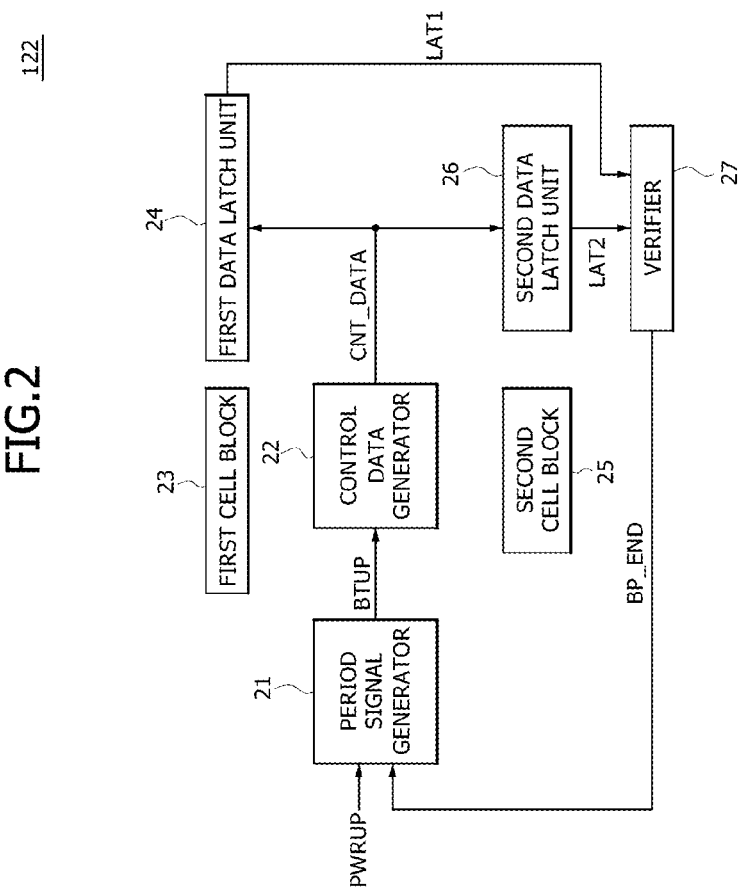
FIG. 2 is a block diagram illustrating a representation of an example of a boot-up operation circuit included in the semiconductor system of FIG. 1.

Referring to FIG. 2, the boot-up operation circuit 122 may include a period signal generator 21, a control data generator 22, and a first cell block 23. The boot-up operation circuit 122 may include a first data latch unit 24, a second cell block 25, a second data latch unit 26, and a verifier 27.

The period signal generator 21 may generate the boot-up period signal BTUP in response to the power-up signal PWRUP and a boot-up end signal BP_END. The boot-up period signal BTUP may be enabled if a level of the power-up signal PWRUP is changed after the power-up period ends. The boot-up period signal BTUP may be disabled if the boot-up end signal BP_END is enabled. The boot-up period signal BTUP may be disabled if control data CNT_DATA are transmitted to the first and second latch units 24 and 26.

The control data generator 22 may execute the boot-up operation while the boot-up period signal BTUP is enabled. The boot-up operation may be an operation that the control data CNT_DATA generated from the control data generator 22 are transmitted to the first and second latch units 24 and 26. The control data CNT_DATA may be stored in an e-fuse array (not illustrated) included in the control data generator 22. The control data CNT_DATA may include information for executing internal control operations of the first and second cell blocks 23 and 25. The information for executing the internal control operations may mean or include repair information or setting information for repairing failed cells. The information included in the control data CNT_DATA for the internal control operation of the first cell block 23 may be transmitted to and latched in the first data latch unit 24 by the boot-up operation, and the information included in the control data CNT_DATA for the internal control operation of the second cell block 25 may be transmitted to and latched in the second data latch unit 26 by the boot-up operation.

The verifier 27 may receive first and second latch signals LAT1 and LAT2 respectively outputted from the first and second latch units 24 and 26 to generate the boot-up end signal BP_END. The boot-up end signal BP_END may be enabled if the boot-up operation is normally executed. For example, the verifier 27 may generate the boot-up end signal BP_END which is enabled if the information included in the control data CNT_DATA for the internal control operation of the first cell block 23 is transmitted to and latched in the first data latch unit 24 and the information included in the control data CNT_DATA for the internal control operation of the second cell block 25 is transmitted to and latched in the second data latch unit 26.

Figure 3:
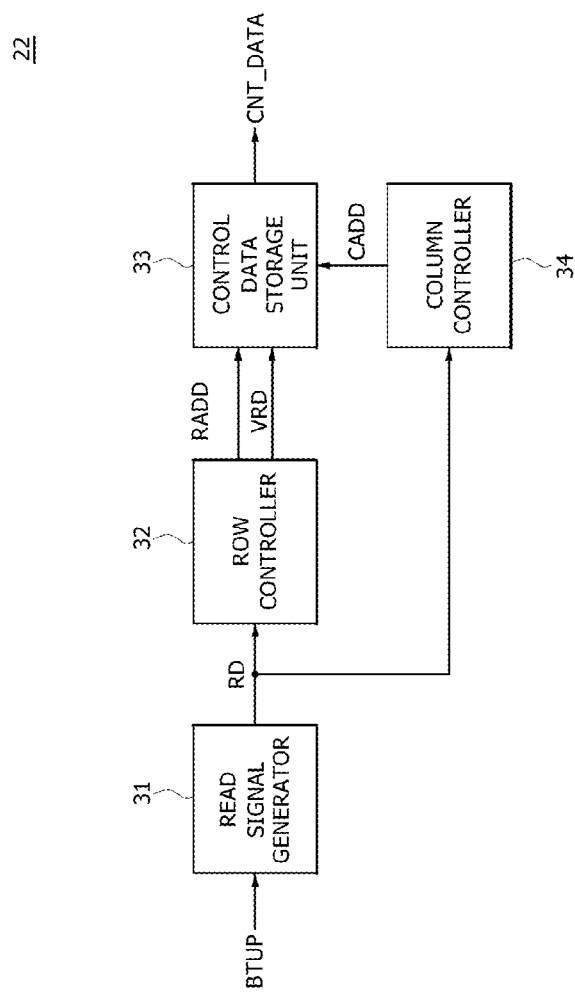
FIG. 3 is a block diagram illustrating a representation of an example of a control data generator included in the boot-up operation circuit of FIG. 2.

Referring to FIG. 3, the control data generator 22 may be configured to include a read signal generator 31, a row controller 32, a control data storage unit 33, and a column controller 34. While the boot-up period signal BTUP is enabled, the read signal generator 31 may generate a read signal RD. The read signal RD may be enabled in order to output the control data CNT_DATA stored in the control data storage unit 33. The row controller 32 may generate a row address signal RADD and an internal voltage signal VRD in synchronization with the read signal RD and may apply the row address signal RADD and the internal voltage signal VRD to the control data storage unit 33. The column controller 34 may generate a column address signal CADD in synchronization with the read signal RD and may apply the column address signal CADD to the control data storage unit 33. The control data storage unit 33 may transmit data of memory cells (not illustrated) connected to a low line (not illustrated) selected by the row address signal RADD to column lines (not illustrated) according to the internal voltage signal VRD and may sense and amplify the data loaded on the selected column lines (not illustrated) to output the amplified data as the control data CNT_DATA.

Figure 4:
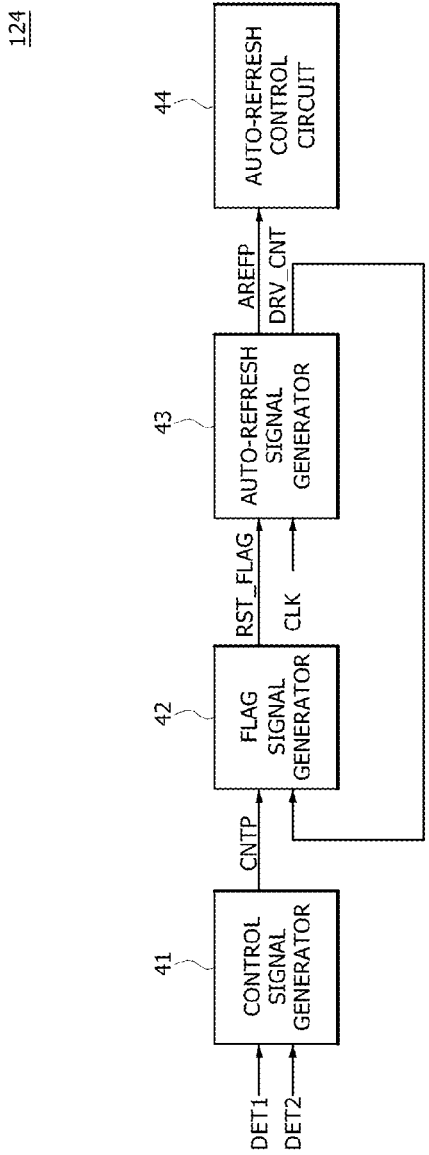
FIG. 4 is a block diagram illustrating a representation of an example of an initialization circuit included in the semiconductor system of FIG. 1.

Referring to FIG. 4, the initialization circuit 124 may include a control signal generator 41, a flag signal generator 42, an auto-refresh signal generator 43 and an auto-refresh control circuit 44.

The control signal generator 41 may generate a pulse of a control signal CNTP in response to the first and second detection signals DET1 and DET2. For example, the control signal generator 41 may generate the pulse of the control signal CNTP if both of the first and second detection signals DET1 and DET2 are enabled. A configuration and an operation of the control signal generator 41 will be described below with reference to FIG. 5 later.

The flag signal generator 42 may generate a flag signal RST_FLAG in response to the control signal CNTP and a drive control signal DRV_CNT. For example, the flag signal generator 42 may generate the flag signal RST_FLAG. The flag signal RST_FLAG may be enabled if the pulse of the control signal CNTP is created. The flag signal generator 42 may generate the flag signal RST_FLAG disabled if the drive control signal DRV_CNT is enabled. Logic levels of the enabled flag signal RST_FLAG and the disabled flag signal RST_FLAG may be set differently according to the various embodiments. A configuration and an operation of the flag signal generator 42 will be described below with reference to FIG. 6 later.

The auto-refresh signal generator 43 may generate the drive control signal DRV_CNT and a pulse of an auto-refresh signal AREFP in response to the flag signal RST_FLAG and a clock signal CLK. For example, the auto-refresh signal generator 43 may generate at least one pulse of the auto-refresh signal AREFP in synchronization with the clock signal CLK if the flag signal RST_FLAG is enabled. The auto-refresh signal generator 43 may generate the drive control signal DRV_CNT. The drive control signal DRV_CNT may be enabled after a predetermined period elapses on the basis of the clock signal CLK from a point of time that the flag signal RST_FLAG is enabled. A logic level of the enabled drive control signal DRV_CNT and a length of the predetermined period may be set differently according to the various embodiments. A configuration and an operation of the auto-refresh signal generator 43 will be described below with reference to FIG. 7 later.

The auto-refresh control circuit 44 may control the execution of the auto-refresh operation for stably retaining the data stored in the memory cells included in the second semiconductor device 12, if the pulse of the auto-refresh signal AREFP is created.

Figure 5:
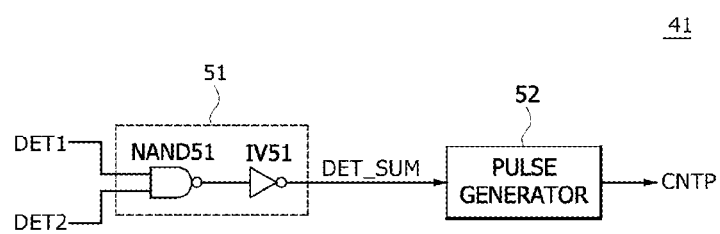
FIG. 5 is a block diagram illustrating a representation of an example of a control signal generator included in the initialization circuit of FIG. 4.

Referring to FIG. 5, the control signal generator 41 may include a detection signal synthesizer 51 and a pulse generator 52. The detection signal synthesizer 51 may include a NAND gate NAND51 and an inverter IV51. The detection signal synthesizer 51 may synthesize the first and second detection signals DET1 and DET2 to generate a synthesized detection signal DET_SUM. For example, the detection signal synthesizer 51 may be configured to generate the synthesized detection signal DET_SUM. The synthesized detection signal DET_SUM may be enabled if both of the first and second detection signals DET1 and DET2 are enabled. The pulse generator 52 may generate the control signal CNTP in response to the synthesized detection signal DET_SUM. For example, the pulse generator 52 may generate a pulse of the control signal CNTP if the synthesized detection signal DET_SUM is enabled.

Figure 6:
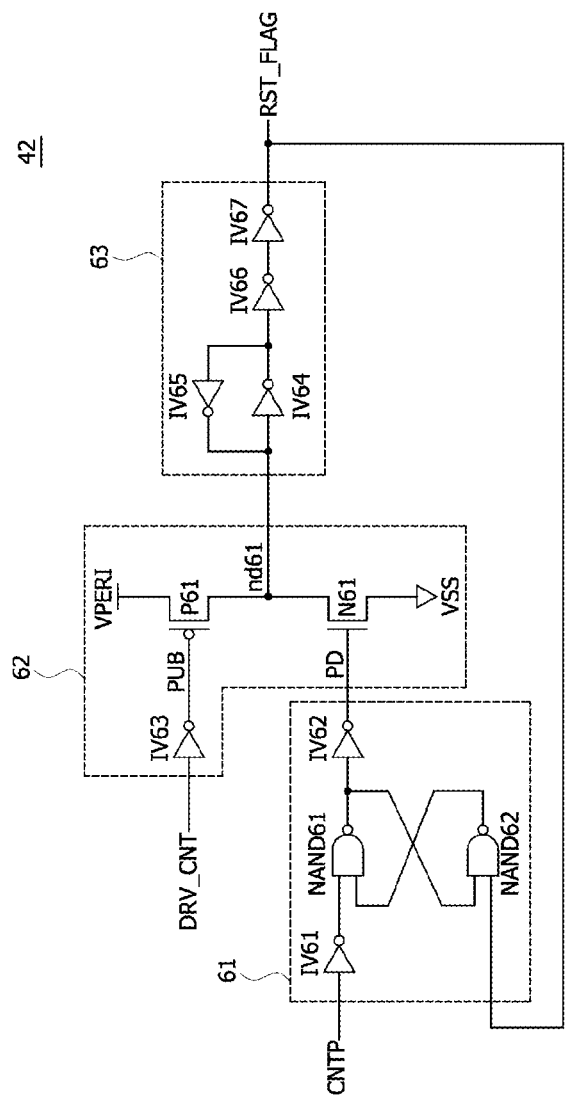
FIG. 6 is a circuit diagram illustrating a representation of an example of a flag signal generator included in the initialization circuit of FIG. 4.

Referring to FIG. 6, the flag signal generator 42 may include a pull-down signal generator 61, a driver 62 and an output unit 63. The pull-down signal generator 61 may include inverters IV61 and IV62 and NAND gates NAND61 and NAND62. The pull-down signal generator 61 may generate a pull-down signal PD. The pull-down signal PD may be enabled to have a logic "high" level if a pulse of the control signal CNTP is inputted to the pull-down signal generator 61, while the flag signal RST_FLAG is disabled to have a logic "low" level. The pull-down signal generator 61 may generate the pull-down signal PD disabled to have a logic "low" level while the control signal CNTP has a logic "high" level. The driver 62 may include an inverter IV63, a PMOS transistor P61 and an NMOS transistor N61. The driver 62 may pull down a node ND61 to a ground voltage VSS if the pull-down signal PD enabled to have a logic "high" level is inputted thereto. The driver 62 may generate a pull-up signal PUB enabled to have a logic "low" level if the drive control signal DRV_CNT enabled to have a logic "high" level is inputted thereto and may pull up the node ND61 to an internal voltage VPERI. The output unit 63 may include inverters IV64, IV65, IV66 and IV67 and may buffer a signal of the node ND61 to generate the flag signal RST_FLAG.

The flag signal generator 42 having the aforementioned configurations may generate the flag signal RST_FLAG enabled if a pulse of the control signal CNTP is created and may generate the flag signal RST_FLAG disabled if the drive control signal DRV_CNT is enabled.

Figure 7:
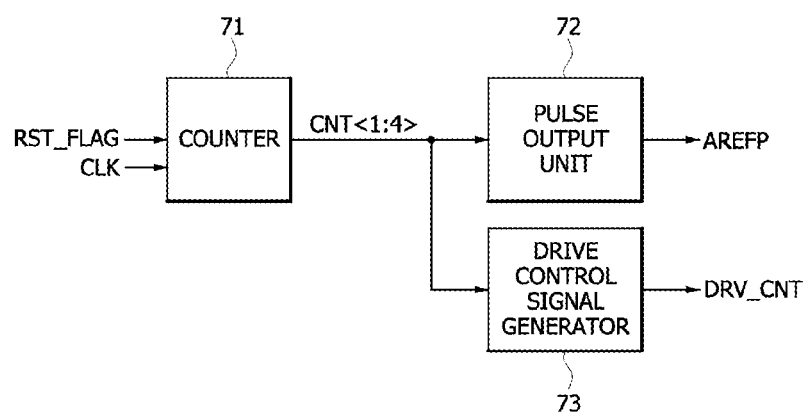
FIG. 7 is a circuit diagram illustrating a representation of an example of an auto-refresh signal generator included in the initialization circuit of FIG. 4.

Referring to FIG. 7, the auto-refresh signal generator 43 may include a counter 71, a pulse output unit 72 and a drive control signal generator 73. The counter 71 may output counted signals CNT<1:4>. The counted signals CNT<1:4> may be sequentially counted in synchronization with the clock signal CLK while the flag signal RST_FLAG is enabled. The pulse output unit 72 may be configured to generate pulses of the auto-refresh signal AREFP whenever the counted signals CNT<1:4> are counted. The drive control signal generator 73 may generate the drive control signal DRV_CNT. The drive control signal DRV_CNT may be enabled if the counted signals CNT<1:4> have the same level combination as a predetermined level combination.

An operation of the auto-refresh signal generator 43 as set forth above will be described hereinafter under the assumption, for example, that the counted signals CNT<1:4> are counted up bit by bit to have level combinations of '0000', '0001', '0010', . . . in sequence while the flag signal RST_FLAG is enabled and the predetermined level combination of the counted signals CNT<1:4> is set to be '0110'.

The auto-refresh signal generator 43 may generate the pulses of the auto-refresh signal AREFP when the counted signals CNT<1:4> have level combinations of '0001', '0010', '0011', '0100', 0101' and '0110'. In addition, the auto-refresh signal generator 43 may generate the drive control signal DRV_CNT enabled when the counted signals CNT<1:4> have a level combination of '0110'. In the counted signals CNT<1:4>, the level combination of '0001' means, for example, that a first counted signal CNT<1> has a logic "high(1)" level and all of second to fourth counted signals CNT<2:4> have a logic "low(0)" level.

Figure 8:
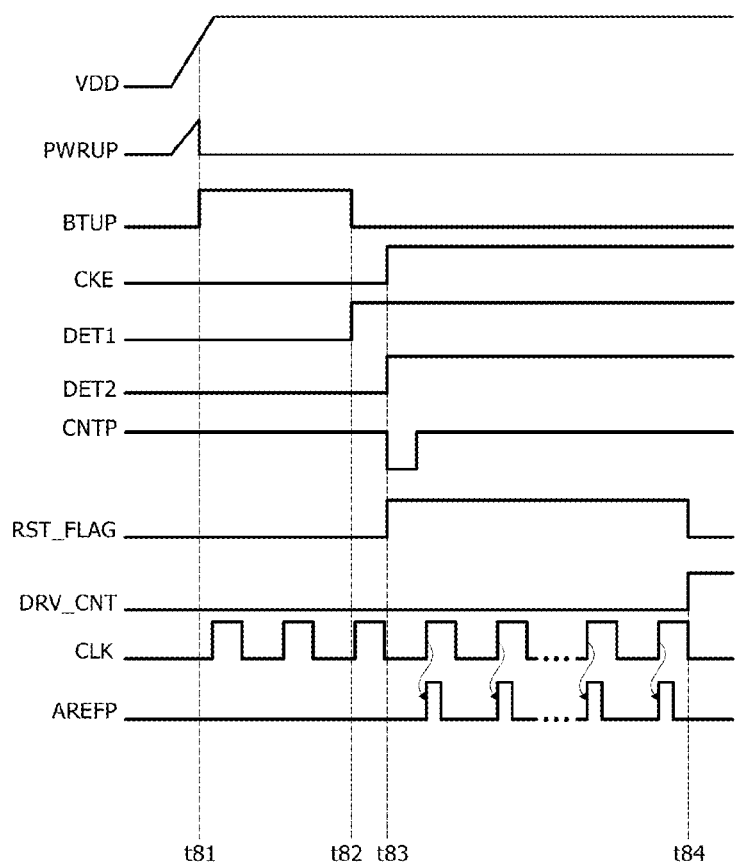
FIG. 8 is a timing diagram illustrating a representation of an example of an operation of the semiconductor system illustrated in FIGS. 1 to 7.

An operation of the semiconductor system described with reference to FIGS. 1 to 7 will be described hereinafter with reference to FIG. 8.

At a point of time "t81", a level of the power-up signal PWRUP may change from a logic "high" level into a logic "low" level because a level of the power supply voltage signal VDD rises up to reach a target voltage level and the power-up period ends. The boot-up period signal BTUP may be enabled to have a logic "high" level due to a level transition of the power-up signal PWRUP. The boot-up period signal BTUP may have an enabled state during a predetermined boot-up operation period (from the point of time "t81" till a point of time "t82") and may be disabled to a logic "low" level after the predetermined boot-up operation period. During the boot-up operation period (t81~t82), the boot-up operation may be executed so that the control data CNT_DATA are transmitted to the first and second data latch units 24 and 26.

The first detection signal DET1 may be enabled to have a logic "high" level in synchronization with the point of time "t82" that the boot-up operation ends, and the second detection signal DET2 may be enabled to have a logic "high" level in synchronization with a point of time "t83" that a level of the clock enablement signal CKE changes from a logic "low" level into a logic "high" level. A pulse of the control signal CNTP may be created in synchronization with the point of time "t83" that both of the first and second detection signals DET1 and DET2 are enabled to have a logic "high" level.

At the point of time "t83", the flag signal RST_FLAG may be enabled to have a logic "high" level by the pulse of the control signal CNTP. At a point of time "t84" that a predetermined period (t83~t84) elapses from the point of time "t83", the flag signal RST_FLAG may be disabled to have a logic "low" level by the drive control signal DRV_CNT which is enabled to have a logic "high" level. The predetermined period (t83~t84) may be set according to a level combination of the counted signals CNT<1:4> generated from the auto-refresh signal generator (43 of FIG. 7). Pulses of the auto-refresh signal AREFP may be created according to the counted signals CNT<1:4> that are counted in synchronization with the clock signal CLK while the flag signal RST_FLAG is enabled to have a logic "high" level. Whenever the pulses of the auto-refresh signal AREFP are created, the auto-refresh operation for stably retaining the data stored in memory cells (not illustrated) included in the second semiconductor device 12 may be executed and controlled.

As described above, the semiconductor system according to an embodiment may execute the auto-refresh operation if the clock enablement signal CKE is enabled after the boot-up operation terminates. That is, the semiconductor system according to an embodiment may execute the auto-refresh operation for stably retaining the data stored in the memory cells when the second semiconductor device 12 is in a condition for a stable operation after the power supply voltage VDD is stabilized. The semiconductor system according to an embodiment may execute the auto-refresh operation based on the boot-up operation and the clock enablement signal CKE. Thus, the initialization operation may be stably executed regardless of a reset command provided from an external system or various mount environments.

Figure 9:
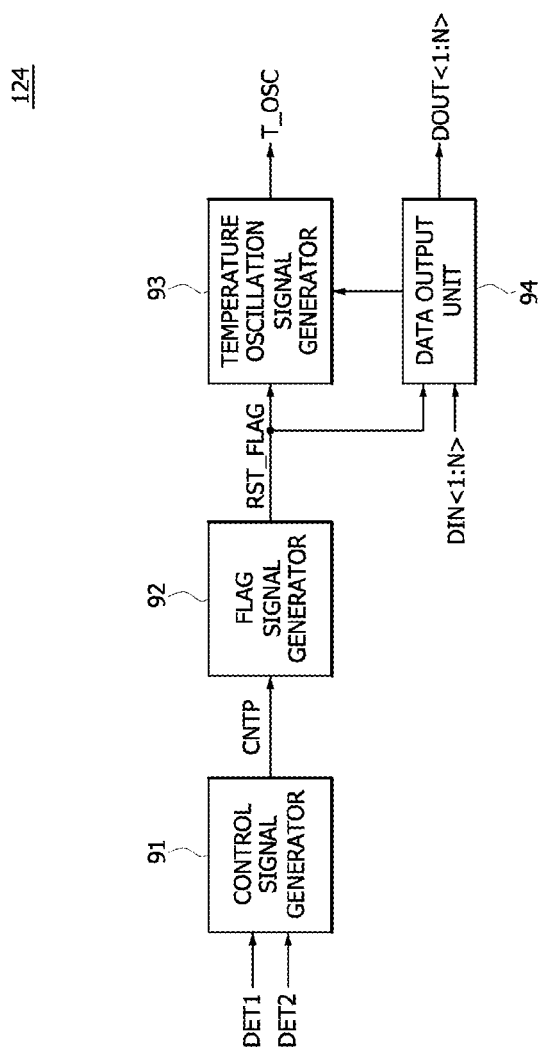
FIG. 9 is a block diagram illustrating a representation of an example of the initialization circuit included in the semiconductor system of FIG. 1.

Referring to FIG. 9, the initialization circuit 124 may include a control signal generator 91, a flag signal generator 92, a temperature oscillation signal generator 93 and a data output unit 94. The control signal generator 91 may generate a pulse of the control signal CNTP in response to the first and second detection signals DET1 and DET2. For example, the control signal generator 91 may generate the pulse of the control signal CNTP if both of the first and second detection signals DET1 and DET2 are enabled. The flag signal generator 92 may generate the flag signal RST_FLAG. The flag signal RST_FLAG may be enabled if the pulse of the control signal CNTP is inputted into the flag signal generator 92. The temperature oscillation signal generator 93 may generate, store and output a temperature oscillation signal T_OSC. The cycle time of the temperature oscillation signal T_OSC may change according to a temperature if the enabled flag signal RST_FLAG is inputted into the temperature oscillation signal generator 93. The temperature oscillation signal generator 93 may be configured to include an oscillator (not illustrated), and the oscillator may be activated to generate the temperature oscillation signal T_OSC if the flag signal RST_FLAG is enabled. The data output unit 94 may receive internal data DIN<1:N> to generate output data DOUT<1:N>, if the enabled flag signal RST_FLAG is inputted thereto. The data output unit 94 may include a circuit for receiving and latching the internal data DIN<1:N>, a circuit for aligning the internal data DIN<1:N>, and a circuit for driving the output data DOUT<1:N>.

A semiconductor system including the initialization circuit 124 having the aforementioned configurations with regards to FIG. 9 may execute various auto-refresh operations for generating the temperature oscillation signal T_OSC and the output data DOUT<1:N>, if the internal data DIN<1:N> is inputted to the initialization circuit 124 after the boot-up operation terminates.

Figure 10:
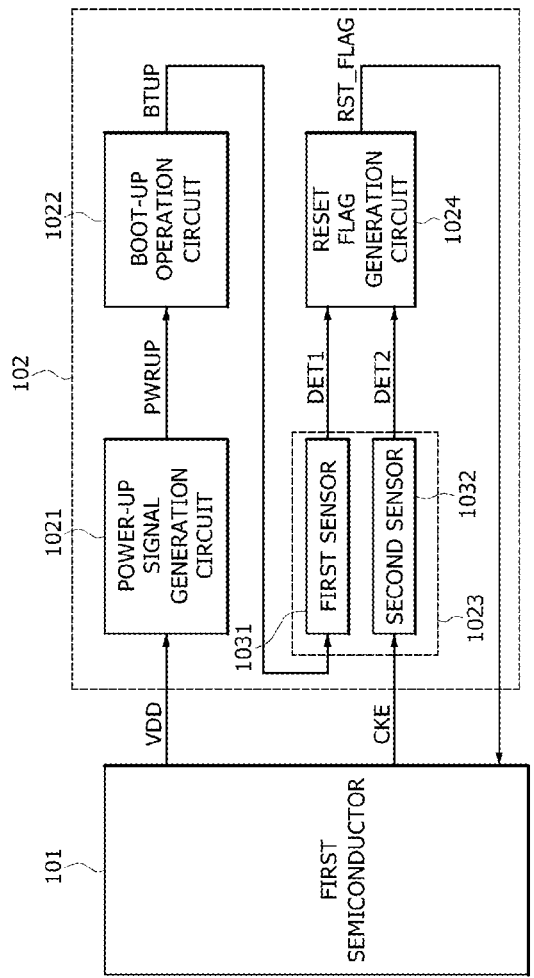
FIG. 10 is a block diagram illustrating a representation of an example of a semiconductor system according to an embodiment.

Referring to FIG. 10, a semiconductor system according to an embodiment may include a first semiconductor device 101 and a second semiconductor device 102. The second semiconductor device 102 may include a power-up signal generation circuit 1021, a boot-up operation circuit 1022, a sensing circuit 1023, and a reset flag generation circuit 1024. The sensing circuit 1023 may include a first sensor 1031 and a second sensor 1032.

The first semiconductor device 101 may apply a power supply voltage signal VDD and a clock enablement signal CKE to the second semiconductor device 102. In some embodiments, the clock enablement signal CKE may be transmitted together with an address signal (not illustrated) through the same signal line. Alternatively, the clock enablement signal CKE and the address signal may be separately transmitted through different signal lines. A level of the power supply voltage signal VDD may be set differently according to the various embodiments.

The power-up signal generation circuit 1021 may sense a level of the power supply voltage signal VDD to generate a power-up signal PWRUP. In some embodiments, the power-up signal PWRUP may be set to have a logic "high" level during a time period (hereinafter, referred to as a power-up period) from a point of time that the power supply voltage signal VDD is applied to the second semiconductor device 102 till a point of time that the power supply voltage signal VDD reaches a target voltage level and may be set to fall down to a logic "low" level from a logic "high" level after the power-up period ends. Alternatively, the power-up signal PWRUP may be set to have a logic "low" level during the power-up period and to rise up to a logic "high" level after the power-up period ends.

The boot-up operation circuit 1022 may generate a boot-up period signal BTUP. The boot-up period signal BTUP may be enabled during a boot-up operation period, in response to the power-up signal PWRUP. The boot-up operation circuit 1022 may generate the boot-up period signal BTUP enabled in synchronization with a point of time that a level of the power-up signal PWRUP is changed after the power-up period ends. After a boot-up operation is executed during the boot-up operation period, the boot-up period signal BTUP may be disabled. A logic level of the enabled boot-up period signal BTUP and a length of the boot-up operation period may be set differently according to the various embodiments.

The first sensor 1031 may sense a point of time that the boot-up period signal BTUP is disabled, thereby generating a first detection signal DET1. For example, the first sensor 1031 may generate the first detection signal DET1 enabled at a point of time that the boot-up period signal BTUP is disabled after the boot-up operation period ends. A logic level of the enabled first detection signal DET1 may be set differently according to the various embodiments.

The second sensor 1032 may generate a second detection signal DET2 in response to the clock enablement signal CKE. For example, the second sensor 1032 may generate the second detection signal DET2 enabled at a point of time that the clock enablement signal CKE is enabled. The first semiconductor device 101 may output the clock enablement signal CKE enabled to generate an internal clock signal (not illustrated) of the second semiconductor device 102. Logic levels of the clock enablement signal CKE and the second detection signal DET2 which are enabled may be set differently according to the various embodiments.

The reset flag generation circuit 1024 may generate a reset flag signal RST_FLAG in response to the first and second detection signals DET1 and DET2 and may apply the reset flag signal RST_FLAG to the first semiconductor device 101. The reset flag generation circuit 1024 may generate the reset flag signal RST_FLAG enabled if both of the first and second detection signals DET1 and DET2 are enabled. The first semiconductor device 101 may verify whether the power supply voltage signal VDD applied to the second semiconductor device 102 is stable and whether the boot-up operation terminates, if the enabled reset flag signal RST_FLAG is inputted thereto.

Figure 11:
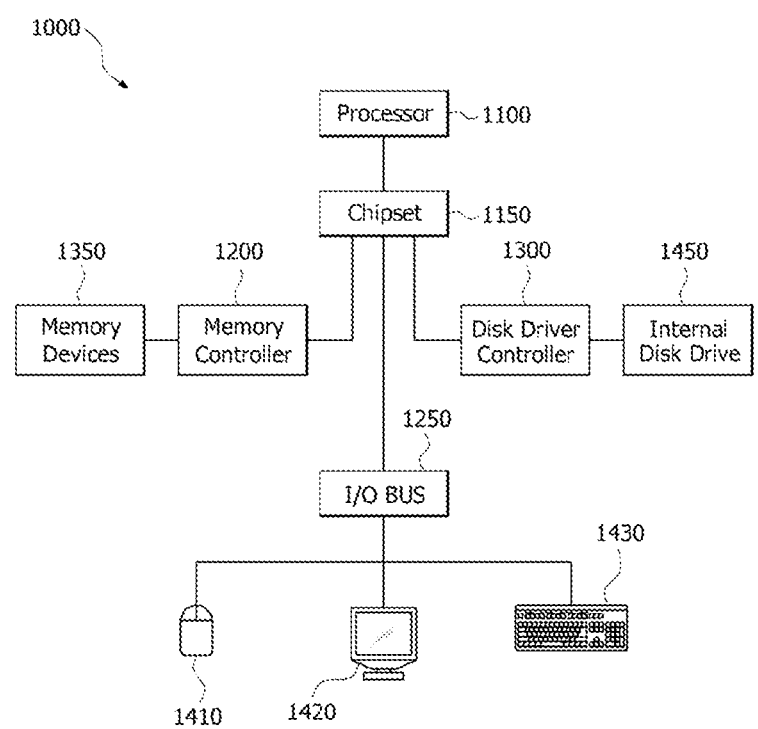
FIG. 11 illustrates a block diagram of an example of a representation of a system employing a semiconductor system and/or semiconductor device in accordance with the various embodiments discussed above with relation to FIGS. 1-10.

The semiconductor system and/or semiconductor devices discussed above (see FIGS. 1-10) are particular useful in the design of memory devices, processors, and computer systems. For example, referring to FIG. 11, a block diagram of a system employing a semiconductor system and/or semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor system and/or semiconductor device as discussed above with reference to FIGS. 1-10. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and/or semiconductor device as discussed above with relation to FIGS. 1-10, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 11 is merely one example of a system 1000 employing a semiconductor system and/or semiconductor device as discussed above with relation to FIGS. 1-10. In alternate embodiments, such as, for example but not limited to, cellular phones or digital cameras, the components may differ from the embodiments illustrated in FIG. 11.

What is claimed is:

1. A semiconductor device comprising:
    a boot-up operation circuit configured for executing a boot-up operation during a boot-up operation period after a power supply voltage signal reaches a predetermined level and configured for generating a boot-up period signal, the boot-up period signal enabled during the boot-up operation period;
    a sensing circuit configured for sensing the boot-up period signal and a clock enablement signal to generate a first detection signal and a second detection signal; and
    an initialization circuit configured for executing an initialization operation in response to the first and second detection signals.

2. The semiconductor device of claim 1, wherein the boot-up operation circuit is configured for transmitting control data stored in a fuse array to first and second data latch units, in response to an internal voltage signal during the boot-up operation period.

3. The semiconductor device of claim 2, wherein the boot-up operation circuit includes:
    a period signal generator configured for generating the boot-up period signal in response to a power-up signal whose level changes after the power supply voltage signal reaches the predetermined level;
    a control data generator configured for generating the control data transmitted to the first and second data latch units, in response to the boot-up period signal; and
    a verifier configured for generating a boot-up end signal in response to a first latch signal outputted from the first latch unit and a second latch signal outputted from the second latch unit.

4. The semiconductor device of claim 3, wherein the boot-up period signal is disabled if the boot-up end signal is enabled.

5. The semiconductor device of claim 3, wherein the control data generator includes:
    a read signal generator configured for generating a read signal in response to the boot-up period signal;
    a row controller configured for generating the internal voltage signal and a row address signal in response to the read signal;
    a column controller configured for generating a column address signal in response to the read signal; and
    a control data storage unit configured for outputting the control data through a data line in response to the internal voltage signal, the row address signal and the column address signal.

6. The semiconductor device of claim 1, wherein the first detection signal is enabled if the boot-up period signal is disabled.

7. The semiconductor device of claim 1, wherein the second detection signal is enabled if the clock enablement signal is enabled.

8. The semiconductor device of claim 1, wherein the initialization circuit is configured for generating a pulse of an auto-refresh signal at least once during a predetermined period if both of the first and second detection signals are enabled.

9. The semiconductor device of claim 1, wherein the initialization circuit includes:
    a control signal generator configured for generating a control signal in response to the first and second detection signals;
    a flag signal generator configured for generating a flag signal in response to the control signal and a drive control signal; and
    an auto-refresh signal generator configured for generating a pulse of an auto-refresh signal and the drive control signal in response to the flag signal and a clock signal.

10. The semiconductor device of claim 9, wherein the control signal generator includes:
    a detection signal synthesizer configured for synthesizing the first and second detection signals to generate a synthesized detection signal; and
    a pulse generator configured for generating a pulse of the control signal in response to the synthesized detection signal.

11. The semiconductor device of claim 9,
    wherein the flag signal generator is configured for generating the flag signal and is configured for generating the flag signal which is disabled if the drive control signal is enabled, and
    wherein the flag signal is enabled if a pulse of the control signal is created.

12. The semiconductor device of claim 9, wherein the flag signal generator includes:
    a pull-down signal generator configured for generating a pull-down signal;
    a driver configured for pulling up an internal node in response to the drive control signal and configured for pulling down the internal node in response to the pull-down signal; and
    an output unit configured for latching and buffering a single of the internal node and configured for outputting the latched and buffered single,
    wherein the pull-down signal is enabled if a pulse of the control signal is created and is disabled if the flag signal is enabled.

13. The semiconductor device of claim 9, wherein the auto-refresh signal generator includes:
    a counter configured for generating counted signals that are counted in synchronization with the clock signal while the flag signal is enabled;
    a pulse output unit configured for generating the pulse of the auto-refresh signal in response to the counted signals; and
    a drive control signal generator configured for generating the drive control signal in response to the counted signals.

14. The semiconductor device of claim 9, wherein the initialization circuit further includes an auto-refresh control circuit that is configured for controlling execution of an auto-refresh operation for stably retaining data stored in memory cells, if the pulse of the auto-refresh signal is created.

15. The semiconductor device of claim 1, wherein the initialization circuit includes:
    a control signal generator configured for generating a control signal in response to the first and second detection signals;
    a flag signal generator configured for generating a flag signal in response to the control signal; and
    a temperature oscillation signal generator configured for generating and storing a temperature oscillation signal whose cycle time changes according to a temperature, in response to the flag signal.

16. The semiconductor device of claim 1, wherein the initialization circuit includes:
   a control signal generator configured for generating a control signal in response to the first and second detection signals;
   a flag signal generator configured for generating a flag signal in response to the control signal; and
   a data output unit configured for receiving internal data in response to the flag signal to drive output data.

17. The semiconductor device of claim 1, wherein the initialization circuit includes:
   a control signal generator configured for generating a control signal in response to the first and second detection signals;
   a flag signal generator configured for generating a flag signal in response to the control signal;
   a temperature oscillation signal generator configured for generating and storing a temperature oscillation signal whose cycle time changes according to a temperature, in response to the flag signal; and
   a data output unit configured for receiving internal data in response to the flag signal to drive output data.

18. A semiconductor device comprising:
   a boot-up operation circuit configured for executing a boot-up operation and configured for generating a boot-up period signal;
   a sensing circuit configured for sensing the boot-up period signal and a clock enablement signal,
   an initialization circuit configured for executing an initialization operation if the clock enablement signal is enabled after the boot-up operation terminates, wherein the boot-up operation transmits control data stored in a fuse array to first and second data latch units.

19. The semiconductor device of claim 18, further comprising:
   memory cells configured to store data and retain the stored data in response to the initialization operation,
   wherein the initialization operation includes an auto-refresh operation for retaining the data stored in the memory cells.

20. The semiconductor device of claim 18, wherein the boot-up operation is executed during a boot-up operation period after a power supply voltage signal reaches a predetermined level.

21. The semiconductor device of claim 20, wherein the boot-up period signal is enabled during the boot-up operation period.

22. The semiconductor device of claim 18,
   wherein the sensing circuit senses the boot-up period signal and the clock enablement signal to generate a first detection signal and a second detection signal, and
   wherein the initialization circuit executes the initialization operation in response to the first and second detection signals.

23. The semiconductor device of claim 18, wherein the initialization operation includes at least one of an auto-refresh operation, a temperature sense initialization operation, a data output initialization operation, and a power supply initialization operation.

* * * * *